US006978438B1

(12) United States Patent
Capodieci

(10) Patent No.: US 6,978,438 B1
(45) Date of Patent: Dec. 20, 2005

(54) OPTICAL PROXIMITY CORRECTION (OPC) TECHNIQUE USING GENERALIZED FIGURE OF MERIT FOR PHOTOLITHOGRAHIC PROCESSING

(75) Inventor: Luigi Capodieci, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 217 days.

(21) Appl. No.: 10/677,154

(22) Filed: Oct. 1, 2003

(51) Int. Cl.[7] .............................................. G06F 17/50
(52) U.S. Cl. .......................................... 716/21; 716/19
(58) Field of Search ................ 716/19–21; 703/13–16; 430/30

(56) References Cited

U.S. PATENT DOCUMENTS

| | | | |
|---|---|---|---|
| 6,243,855 B1 | 6/2001 | Kobayashi et al. | |
| 6,381,731 B1 | 4/2002 | Grodd | |
| 6,397,372 B1 | 5/2002 | Bozkus et al. | |
| 6,415,421 B2 | 7/2002 | Anderson et al. | |
| 6,425,113 B1 | 7/2002 | Anderson et al. | |
| 6,430,737 B1 | 8/2002 | Cobb et al. | |
| 6,544,699 B1 * | 4/2003 | Kim et al. | 430/30 |
| 6,563,566 B2 * | 5/2003 | Rosenbluth et al. | 355/67 |
| 6,643,616 B1 * | 11/2003 | Granik et al. | 703/13 |
| 2004/0005089 A1 * | 1/2004 | Robles et al. | 382/141 |
| 2004/0133871 A1 * | 7/2004 | Granik et al. | 716/19 |
| 2005/0044513 A1 * | 2/2005 | Robles et al. | 716/4 |
| 2005/0066300 A1 * | 3/2005 | Zach | 716/19 |

OTHER PUBLICATIONS

Schellenberg, at al. A New Process Monitor for Reticles and Wafers: The MEEF Meter, Presented at SPIE's Microlithography 2000 Symposium, Feb. 27 to Mar. 3, 2000.

Schulze and Lacour. A GDS-based Mask Data Preparation Flow—Data Volume Containment by Hierarchical Data Processing. Mentor Graphics; Deep Submicron Technical Publications, Nov. 2002.

Torres and Maurer. Alternatives to Alternating Phase Shift Masks for 65nm. Mentor Graphics; Deep Submicron Technical Publications, Nov. 2002.

Torres, et al. Design Verification Flow for Model Assisted Double Dipole Decompositon. Mentor Graphics; Deep Submicron Technical Publications, Sep. 2002.

Capodieci, et al. Effects of Advanced Illumination Schemes on Design Manufacturability and Interactions with Optical Proximity Corrections. Mentor Graphics; Deep Submicron Technical Publications, Sep. 2000.

(Continued)

*Primary Examiner*—Matthew Smith
*Assistant Examiner*—Naum Levin
(74) *Attorney, Agent, or Firm*—Renner, Otto, Boisselle & Sklar, LLP

(57) ABSTRACT

A method and associated computer program for making optical proximity corrections for a reticle layout topology. Edge segments of the reticle layout topology are manipulated to generate a corrected reticle layout accounting for optical distortions and, based on the corrected reticle layout, a plurality of individual figure of merit values are generated. A generalized figure of merit (GFOM) using the plurality of individual figure of merit values is then generated.

22 Claims, 2 Drawing Sheets

OTHER PUBLICATIONS

Cobb and Sahouria. Hierarchical GDSII-based fracturing and job deck system. Mentor Graphics; Deep Submicron Technical Publications, Nov. 2001.

Schellenburg. Impact of RET on Physical Layouts. Mentor Graphics; Deep Submicron Technical Publications, Apr. 2001.

Schellenberg, et al. OPC Beyond 0.18 μm: OPC on PSM Gates. Mentor Graphics. Mentor Graphics; Deep Submicron Technical Publications, Nov. 2001. Presented at SPIE's Microlithography 2000 Symposium Feb. 27-Mar. 3, 2000.

Torres, et al. RET Compliant Cell Generation for sub-130nm Processes. Mentor Graphics; Deep Submicron Technical Publications, Jun. 2002.

Vandenberghe, et al. (Sub-) 100nm Gate Patterning Using 248nm Alternating PSM. Mentor Graphics; Deep Submicron Technical Publications, May 2001.

Granik, et al. Sub-resolution Process Windows and Yield Estimation Technique Based on Detailed Full-chip CD Simulation. Mentor Graphics; Deep Submicron Technical Publications, Sep., 2000.

Schellenberg and Moore. Verifiable OPC Methodologies. Mentor Graphics; Deep Submicron Technical Publications, Mar., 1999.

* cited by examiner

US 6,978,438 B1

OPTICAL PROXIMITY CORRECTION (OPC) TECHNIQUE USING GENERALIZED FIGURE OF MERIT FOR PHOTOLITHOGRAHIC PROCESSING

TECHNICAL FIELD

The present invention relates generally to the field of integrated circuit manufacture and, more particularly, to a method of correcting a photolithographic pattern layout using optical proximity correction (OPC) that incorporates a generalized figure of merit.

BACKGROUND

The formation of various integrated circuit (IC) structures often relies on photolithographic processes, or photolithography. For instance, a protective mask arrangement can be formed from a photo resist (PR) layer by passing light energy through a mask (or reticle) having a pattern corresponding to the desired arrangement to expose the PR layer. As a result, the pattern of the reticle is transferred to the PR layer. In areas where the PR is sufficiently exposed and after a development cycle, the PR material can become soluble such that it can be removed to selectively expose an underlying layer (e.g., a semiconductor layer, a metal or metal containing layer, a dielectric layer, etc.). Portions of the PR layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the PR layer is transferred to the underlying layer. Alternatively, the PR layer can be used to block dopant implantation into the protected portions of the underlying layer or retard reaction of the protected portions of the underlying layer. Thereafter, the remaining portions of the PR layer can be stripped.

There is a pervasive trend in the art of IC fabrication to increase the density with which various structures are arranged. For example, line widths and the separation between lines is becoming increasingly smaller. For example, nodes with a critical dimension of about 45 nanometers (nm) to about 65 nm have been proposed. In these sub-micron processes, silicon yield is affected by factors such as reticle/mask pattern fidelity, optical proximity effects and PR processing. Some of the more prevalent concerns include line end pullback, corner rounding and line-width variations. These concerns are largely dependent on local pattern density and topology.

Optical proximity correction (OPC) has been used to improve image fidelity. In general, current OPC techniques involve running a computer simulation that takes an initial data set having information relating the desired pattern and manipulates the data set to arrive at a corrected data set in an attempt to compensate for the above-mentioned concerns. Briefly, the OPC process can be governed by a set of optical rules (i.e., "rule-based OPC" employing fixed rules for geometric manipulation of the data set), a set of modeling principles (i.e., "model-based OPC" employing predetermined behavior data to drive geometric manipulation of the data set) or a hybrid combination of rule-based OPC and model-based OPC.

The computer simulation can involve iteratively refining the data set using an edge placement error value as a benchmark for the compensating process. That is, the data set is manipulated based on the rules and/or models and the predicted placement of the edges contained in the pattern are compared against their desired placement. For each edge, or segment thereof depending on how the edges are fragmented in the data set, a determination of how far the predicted edge/segment placement deviates from the desired location is derived. For instance, if the predicted edge placement corresponds to the desired location, the edge placement error for that edge will be zero. As the predicted edge placement varies from the desired location, a positive or negative value in nanometers (or fractions thereof) can be derived. The placement error values for each edge/segment are aggregated to derive a single edge placement error value for the iteration of the OPC simulation. In some OPC routines, when the edge placement error for the iteration falls below a predetermined threshold, a corrected data set is output by the computerized OPC simulation and that corrected data set is used in fabrication of the reticle.

Current OPC techniques work fairly well when the critical dimension is relatively large (e.g., 0.25 microns and larger). That is, using OPC with edge placement error as the driving factor, the corrected data set can become highly tuned. However, the Applicants have found that as IC structures become smaller, correction of the pattern data set using conventional techniques can lead to unexpected instability in the corrected data set if one or more process factors (e.g., focus, exposure dose or other illumination condition) were to change. This instability can result even if each process factor remains within its respective tolerances.

For example, using a set of given process factors (e.g., a certain focus, a certain exposure dose, etc.), the OPC process may position various points (or edge segments) to be within a given distance from corresponding desired locations using the edge placement error value. However, during actual illumination, a process factor could become slightly altered (e.g., focus could change by a few percent) that causes one or more of the corrected points to move more than an acceptable amount. In an simplified example, three points (named herein as points A, B and C) in the data pattern may be corrected and, under most process variations, will fall within a given level of acceptability to a desired location when imaged through the reticle. However, as a result of the OPC correction process making corrections to each of the points A, B and C, one point (for instance, point C) could become overly sensitive to one or more process factors, such as focus and/or expose dose. As the imaging system (e.g., a stepper) moves to expose various areas on a wafer, each process factor may change slightly. Therefore, during a particular exposure of the wafer to expose points A, B and C, the light pattern for point C could place point C at a relatively distant and unacceptable position from its desired location (e.g., about 15 nm from the desired location) due to a change in the process factor for which point C has become overly sensitive. In fact, some points could become so sensitive to certain process factors that the OPC process may introduce a larger error than if the OPC process had not been carried out.

Accordingly, there exists a need in the art for an improved methodology for simulated correction of a photolithographic pattern.

SUMMARY OF THE INVENTION

According to one aspect of the invention, the invention is directed to a method for making optical proximity corrections for a reticle layout topology. The method includes manipulating edge segments of the reticle layout topology to generate a corrected reticle layout accounting for optical distortions; generating a plurality of individual figure of merit values associated with the corrected reticle layout; and generating a generalized figure of merit (GFOM) using the plurality of individual figure of merit values.

According to another aspect of the invention, the invention is directed to a program embodied in computer readable medium to make optical proximity corrections for a reticle layout topology. The program includes code that manipulates edge segments of the reticle layout topography to generate a corrected reticle layout accounting for optical distortions; code that generates a plurality of individual figure of merit values associated with the corrected reticle layout; and code that generates a generalized figure of merit (GFOM) using the plurality of individual figure of merit values.

BRIEF DESCRIPTION OF DRAWINGS

These and further features of the present invention will be apparent with reference to the following description and drawings, wherein.

DISCLOSURE OF INVENTION

Figure 1:
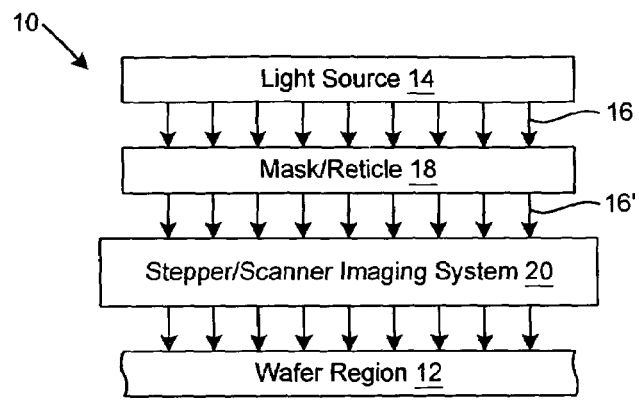
FIG. 1 is a schematic block diagram of a exemplary integrated circuit processing arrangement.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

The present invention includes a method of correcting a desired integrated circuit (IC) pattern using an optical proximity correction (OPC) simulation tool. The OPC simulation tool can use rule-based and/or model-based correction techniques to modify the pattern for layout on a mask (or reticle) used in photolithographic processing of an integrated circuit wafer. Adjustments to the pattern are made using a generalized figure of merit (GFOM) that accounts for a variety of process characteristics, also referred to as metrics. Example process metrics used in computation of the GFOM can include, but are not limited to, edge placement error, image contrast, depth of focus, image log slope, fragmentation complexity, etc.

The present invention will be described in the exemplary context of the design process for ultimate patterning a layer of silicon (e.g., polysilicon) that forms a part of an IC. Example ICs could include general use processors made from thousands or millions of transistors, a flash memory array or any other dedicated circuitry. However, one skilled in the art will appreciate that the methods and devices described herein can also be applied to the design process and/or manufacture of any article manufactured using photolithography, such as micromachines, disk drive heads, gene chips, micro electromechanical systems (MEMS) and so forth.

In one embodiment, the layout correction described herein can involve a mapping technique where polygon edge fragments from a beginning reticle layout corresponding to the desired IC pattern are iteratively manipulated into a corrected reticle layout. The correction process accounts for interference patterns and distortions introduced during imaging of a target wafer using an optical system.

Referring initially to FIG. 1, illustrated is a schematic block diagram of a exemplary IC processing arrangement that includes an optical system 10 used to image a pattern onto a wafer 12. The general arrangement of the optical system 10 is relatively well known in the art and will not be described in great detail. The optical system 10 can include a light source 14 for directing light energy 16 towards a mask, also referred to herein as a reticle 18. The light energy can be, for example, partially coherent light. An example wavelength for the light energy can be about 193 nm as produced by an argon-fluoride laser. The optical system 10 can be arranged such that the light energy 16 can be used to produce IC nodes on the wafer 12 having a critical dimension (CD) of, for example, 130 nm, 100 nm, 65 nm and so forth. It is also contemplated that other wavelengths, such as 157 nm and extreme-ultraviolet wavelengths, can also be used to produce even smaller CDs, such as 45 nm.

The reticle 18 blocks light energy 16 for certain predetermined portions of the wafer 12 such that a light pattern 16' defined by the reticle 18 layout is transferred to the wafer 12. A stepper/scanner imaging system 20 sequentially directs the light pattern 16' transmitted by the reticle 18 to a series of desired locations on the wafer 12.

Figure 2:
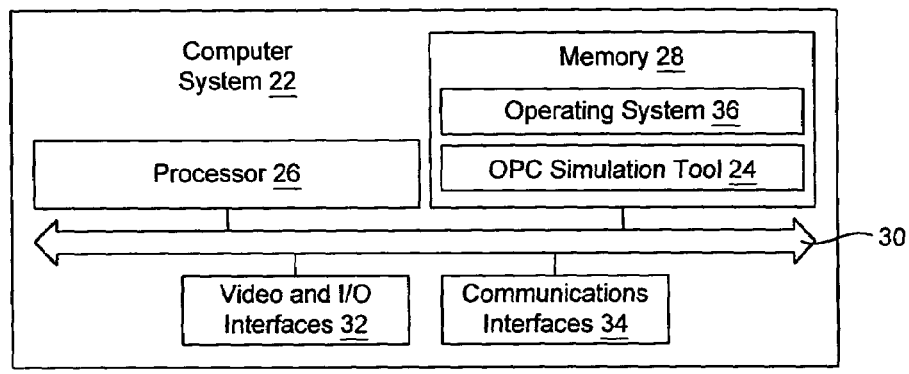
FIG. 2 is a schematic block diagram of a computer system capable of executing an optical proximity correction (OPC) simulation tool in accordance with the present invention.

Turning now to FIG. 2, a schematic block diagram of a computer system 22 capable of executing an OPC simulation tool 24 in accordance with the present invention is illustrated. As indicated, the OPC simulation tool 24 is used to iteratively make adjustments to a reticle layout using a GFOM to account for process variations introduced by the optical system 10 and the optical distortions created by the pattern itself (e.g., optical interference, diffraction, etc.). In one embodiment, the OPC simulation tool 24 is embodied as a computer program (e.g., a software application including a compilation of executable code).

To execute the OPC simulation tool 24, the computer system 22 can include one or more processors 26 used to execute instructions that carry out a specified logic routine. In addition, the computer system 22 can have a memory 28 for storing data, software, logic routine instructions, computer programs, files, operating system instructions, and the like. The memory 28 can comprise several devices and includes, for example, volatile and non-volatile memory components. As used herein, the memory 28 can include, for example, random access memory (RAM), read-only memory (ROM), hard disks, floppy disks, compact disks (e.g., CD-ROM, DVD-ROM, CD-RW, etc.), tapes, and/or other memory components, plus associated drives and players for these memory types. The processor 26 and the memory 28 are coupled using a local interface 30. The local interface 30 can be, for example, a data bus with accompanying control bus, a network, or other subsystem.

The computer system 22 can have various video and input/output interfaces 32 as well as one or more communications interfaces 34. The interfaces 32 can be used to coupled the computer system 22 to various peripherals and networked devices, such as a display (e.g., a CRT display or LCD display), a keyboard, a mouse, a microphone, a camera, a scanner, a printer, a speaker and so forth. The interfaces 34 can be comprised of, for example, a modem and/or network interface card, and can enable the computer system 22 to send and receive data signals, voice signals, video signals, and the like via an external network, such as the Internet, a wide area network (WAN), a local area network (LAN), direct data link, or similar wired or wireless system.

The memory 28 stores an operating system 36 that is executed by the processor 26 to control the allocation and usage of resources in the computer system 22. Specifically, the operating system 36 controls the allocation and usage of the memory 28, the processing time of the processor 26 dedicated to various applications being executed by the processor 26, and the peripheral devices, as well as performing other functionality. In this manner, the operating system 36 serves as the foundation on which applications, such as the OPC simulation tool 24, depend as is generally known by those with ordinary skill in the art.

Figure 3:
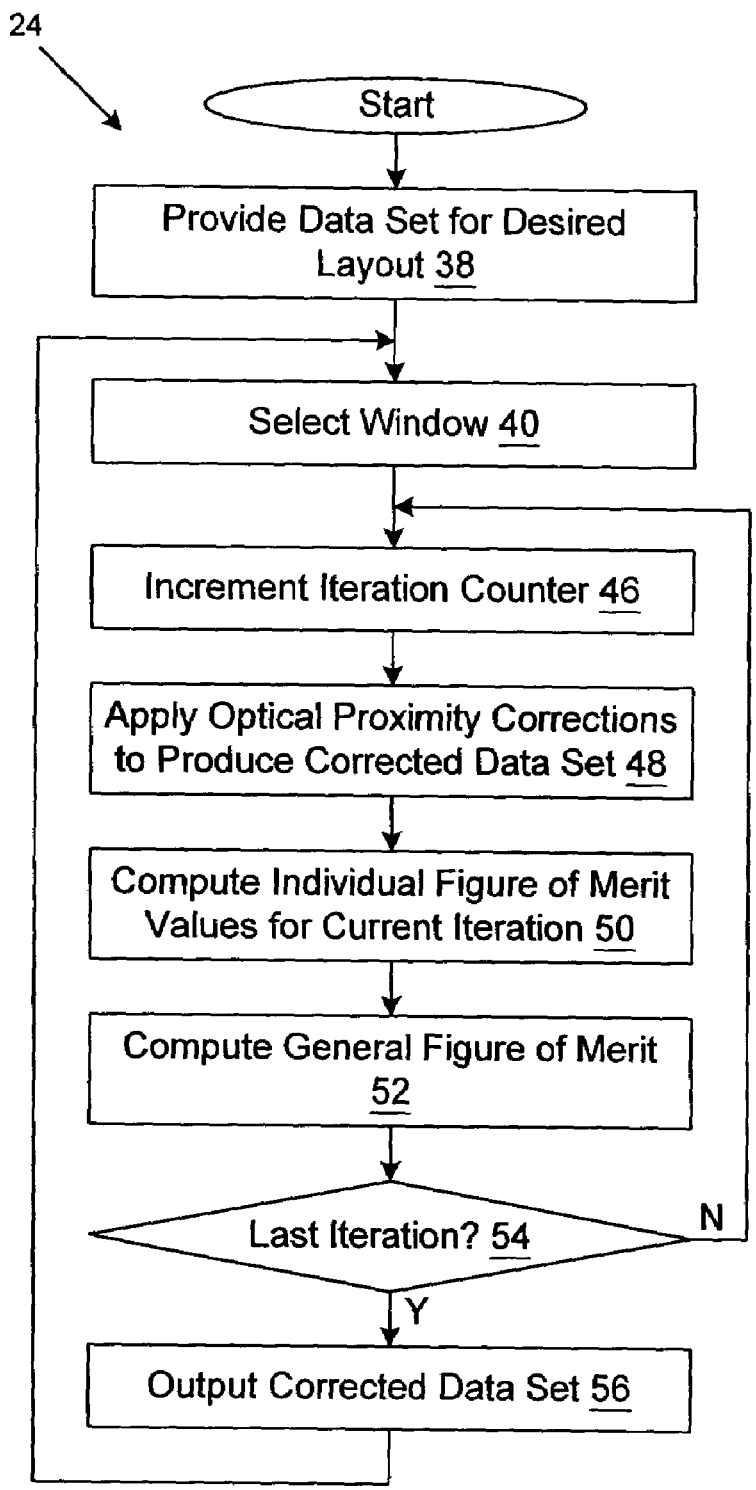
FIG. 3 is a flow chart of an example embodiment of the OPC simulation tool.

With additional reference to FIG. 3, shown is a flow chart of an example embodiment of the OPC simulation tool 24. The flow chart of FIG. 3 can be thought of as depicting steps of a method implemented in the computer system 22.

The method, as specified by the OPC simulation tool 24, can begin in block 38 where a beginning reticle layout corresponding to a desired topology of an IC layer is provided in the form of a data set. As will become clear through the following description, the OPC simulation tool 24 acts on this topographical data set to assist in the design of a final reticle layout that will be used to achieve the desired IC layer topology through the photolithographic process.

The data set, in one embodiment, can include geometrical representations of the structures to be formed on the wafer from a layer of material, including layout information regarding the size and relative position of each structure. For example, if the layer is to be used to form polysilicon gate electrodes, the data set can include a plurality of rectangles (and other polygons) with location information such that upon ultimate formation of the gate electrodes, the gate electrodes are formed over a substrate of the wafer in locations to define corresponding channels between a source and a drain of each device.

Thereafter, in block 40, a region of topology is selected for OPC. With additional reference to FIG. 4, this region will be referred to as a window 42. In one example, the window 42 is a two micron diameter circle of the topology. Other window 42 sizes and shapes (e.g., a square, an ellipse, etc.) can be selected. However, a two micron window 42 is an advantageous size and shape for conducting OPC on a data set corresponding to an IC layer topology patterned by photolithography using a 193 nm wavelength light source since structures falling outside the two micron window tend not to optically disturb those structures in the window 42. It is noted that the OPC simulation process described herein for one window can be carried out multiple times by logically moving (or "sliding") the window 42 over the topology until all of the topology is run through the OPC process. As the window is slid over the topology, overlap from one window to the next can be made, if desired. As a result, the OPC simulation may be carried out hundreds or thousands of time to make corrections to the entire topology. In one example, the topology could be the pattern of an IC layer disposed across an entire IC chip, such as a processor having dimensions of about 26,000 microns by 35,000 microns.

Figure 4:
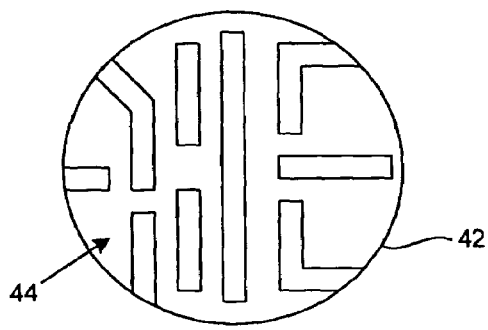
FIG. 4 is a simplified example of a desired pattern layout for an integrated circuit.

Polygons corresponding to an example IC layer topology 44 are illustrated in FIG. 4. As should be appreciated, the IC layer topology 44 represented in FIG. 4 shows only a handful of edges and is shown only to assist in the discussion herein. Actual topologies of IC layers often have hundreds of edges (e.g., about 500 edges) within a given two micron window. Also, the illustrated topology 44 in not indicative of any particular actual IC layer topology. In addition, the polygonal structures shown in FIG. 4 represent only the portion of the overall IC layer topology 44 that happens to fall within the selected process window 42.

With continuing reference to FIG. 3, the OPC simulation tool 24 can continue in block 46 where an iteration counter is incremented. During a first pass through the OPC simulation tool 24 for the window 42 selected in block 40, the iteration counter can be set to a value of one. For a second pass through the OPC simulation tool 24 for the window 42 selected in block 40, the iteration counter can be set to a value of two, and so on.

Thereafter, in block 48, the OPC simulation tool 24 can use rule-based OPC and/or model-based OPC to make modifications to the portion of the data set provided in block 38 and falling within the window 42 selected in block 40. On a first pass through the OPC simulation tool 24 for a window 42, the corrections of block 48 are made on previously unmodified data (e.g., the original data set of block 38). However, on subsequent passes through the OPC simulation tool 24, the corrections are made on data as corrected by all previous passes through the OPC simulation tool 24 for the window 42 selected in block 40. As will be discussed below, the refinements made during the second, third and higher iterations are made using the GFOM.

Rule-based OPC uses a set of fixed rules for geometrically manipulating the data set. For instance, to minimize line end pull-back, "hammer heads" or "bunny-ears" can be added to the line ends, depending on other nearby structures. Model-based OPC uses a set of modeling principles that incorporates predetermined behavior data to drive geometric manipulation of the data set. As indicated, the OPC correction process can use either rule-based corrections or model-based corrections, or a combination of both techniques. In addition, the rules and/or models can vary from iteration to iteration for the topology 44 contained in the window 42 currently being processed. For example, on a first iteration, rule-based OPC techniques can dominate the simulation process. As the iteration counter increases, model-based OPC techniques can play a larger role in the simulation process. In addition, as the iteration counter increases, a damping technique can be used to avoid repeated over-correction of the data set followed by under-correction of the data set. The OPC process can be conducted using specified conditions, such as best focus, a certain dose or other illumination condition.

Figure 5:
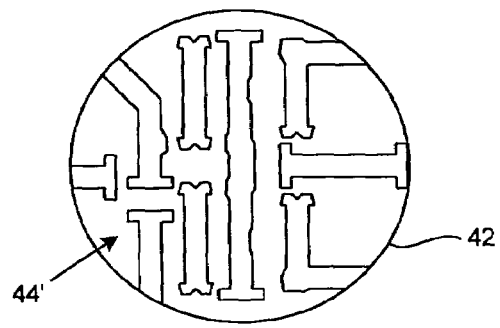
FIG. 5 is a simplified example of a corrected version of the desired pattern layout of FIG. 4 following processing by the OPC simulation tool.

With additional reference to FIG. 5, the OPC process can manipulate segments (also referred to in the art as fragments) of each edge of each geometrical shape falling within the window 42 to arrive at a corrected data set corresponding to a corrected reticle 18 topology 44' for the window 42. That is, each edge can be broken down into a plurality of segments that can be moved "inward" or "outward" depending on the rules and/or models applied during the OPC process. It is noted that the segments should not be shorter than can be physically achieved on the reticle.

After the OPC simulation tool 24 carries out a correction process in block 48, the OPC simulation tool 24 can continue in block 50. Block 50 can include calculating a plurality of individual figure of merit values for the portion of the data set corrected in block 48. The individual figure of merit values relate to various process metrics involved with the photolithograph process. These metrics can each contribute to local CD accuracy.

One of the individual figure of merit values can be used to indicate edge placement error. Determining an edge placement error value can involve comparing the predicted placement of each edge segment (or representative edge segments) against the desired placement of those edge segments according to the desired layout. In one embodiment, a determination of how far the segment deviates from the desired location is derived in a given unit of measure (such as nanometers or fractions of nanometers). For instance, if the predicted edge placement corresponds to the desired location, the edge placement error for that edge will be zero. As the predicted edge placement varies from the desired location, a positive or negative value in nanometers can be derived, such as +2 nm from the desired location or −5 nm from the desired location. As is understood in the art, the edge placement error values for each segment can be aggregated to derive a single edge placement error value for the iteration of the OPC simulation.

Although edge placement error is a significant consideration, other factors that contribute to the local CD accuracy can be quantified in the form of additional individual figure of merit values for use in driving the OPC process of block 48 in subsequent iterations of the OPC simulation tool 24.

For example, another individual figure or merit value can be used to indicate predicted image contrast of the light pattern 16' transmitted by the reticle 18 in an area corresponding to the window 42. Contrast is the ratio of light intensity between a high point of light transmission by the reticle 18 and a low point of light transmission by the reticle 18. Contrast is a leading indicator of the quality of the image projected onto the wafer 12.

Another individual figure of merit value can be used to indicate predicted image slope, or slope of transition, of the light pattern 16' from points of high light transmission to points of low light transmission or no light transmission. In one embodiment, the image slope can be expressed as a logarithmic value and referred to as image log slope. Image slope provides an indication of how robust the image transmitted by the reticle 18 is to variations in focus of the optical system 10.

Another individual figure of merit value can be used to indicate predicted depth of focus of the light pattern 16'. The depth of focus can be another indicator of the quality of the image projected onto the wafer 12.

Yet another individual figure of merit value can be used to indicate edge fragmentation complexity. As the number of segments (or fragments) that any particular edge is broken into increases, the ability to correct for image distortions also increases. However, segment length is limited by the segment size physically achievable on reticle 18. In addition, the greater the number of segments within the window 42, the greater the number of vertices and coordinates that will be present in the data set. As the information associated with the data set becomes larger, the computations carried out by the OPC simulation tool 24 also increases. This results in a desire to optimize the number of edge segments to balance image correction quality and processing time. Therefore, an indication of fragmentation complexity can be useful in assisting to assess how accurate the corrections may be given the physical limitations of the reticle 18 and/or decisions made in how to segment various lines to shorten OPC simulation run time.

As should be appreciated, additional individual figure of merit values can be derived in block 50. Therefore, the individual figure of merit values are not limited to the values described herein. As will be described in greater detail below, the individual figure of merit values are used in ascertaining the GFOM. The GFOM from each iteration of the OPC simulation tool 24 for the window 42 is used in block 48 of the next iteration as a benchmark for conducting OPC modifications to the data set.

To assist the user of the OPC simulation tool 24 in deriving an appropriate GFOM for the desired IC layer topology and for the optical system 10 available to image the wafer, the OPC simulation tool 24 can include the ability for the user to add user definable individual figure of merit values. For example, any process metric or other consideration relating to the photolithographic process that can be predicted or otherwise quantified can be added to the set of individual figure of merit values derived in step 50.

With continuing reference to FIG. 3, the OPC simulation tool 24 can continue in block 52 where the GFOM is calculated. Once calculated, the GFOM can be used by the OPC simulation tool 24 in a manner similar to the way that conventional OPC simulations have used edge placement error as a single-value metric for optimizing local CD accuracy. That is, the GFOM calculated in block 52 of an iteration of the OPC simulation tool 24 is used during the immediately subsequent iteration of the OPC simulation tool 24 in block 48 as a benchmark for the rule-based and model-based modifications made to the data set in block 48. For instance, the GFOM from one iteration to the next can be compared (e.g., to compute a gradient) so that a determination can be made as to whether the GFOM is being made smaller or larger from iteration to iteration. The results of the comparison can be used to assist in determining what additional modifications should be made to the data set.

The GFOM is a function of the individual figure of merit values calculated in block 50. In one embodiment, the GFOM can be the weighted sum of each individual figure of merit value. For example, equation 1 shows GFOM calculated as the weighted sum of the individual figure of merit values for edge placement error (EPE), image contrast (CNT), image log slope (ILS), depth of focus (DF) and fragmentation complexity (FC).

$$GFOM = \alpha(EPE) + \beta(CNT) + \gamma(ILS) + \delta(DF) + \epsilon F(FC) \quad \text{Eq. 1}$$

In equation 1, each individual figure of merit value is associated with a weighting coefficient value (symbolized by the lowercase Greek letters). Each weighting coefficient can be selected to increase or decrease the relative importance of the associated individual figure of merit value. To eliminate a particular individual figure of merit value from consideration, the associated weighting coefficient can be set to zero. Also, each term in the weighted sum can be a linear or non-linear function of the associated individual figure of merit value, rather than just a weighted product of the raw individual figure of merit value.

The weighting coefficients can be selected to increase or reduce the impact that one or more process factors may have on the transmitted light pattern 16'. In one example, the GFOM can be calculated such that edge placement is a dominate consideration in determining what pattern modifications to make during the OPC simulation. However, secondary considerations can also be introduced by way of the GFOM. For instance, the GFOM can be derived to account for pattern modifications that might contribute to sensitivity of variations in focus of the optical system 10 during illumination of the wafer 12. In this manner, edge placement error is not the single driving factor in the OPC process. Rather, some modifications that may lead to decreasing edge placement error may not be made or only partially made. As a result, in certain circumstances, the image quality resulting from a reticle 18 made in accordance with the corrected data set of the OPC simulation tool 24 may have slightly more distortion than conventionally corrected images (i.e., OPC routines using only edge placement error), but will be "more robust to" (e.g., more tolerant of) process variations that may occur during the imaging process. In one example, the user can select weighting coefficients to account for variations in focus such that image quality and focus tolerance can be optimized. In another example, the user can decide to optimize edge placement with focus and exposure dose considerations by selecting appropriate weighting coefficients for individual figure of merit values that have a correlation with edge placement as well as focus and exposure dose sensitivity. In another example, the designer may be concerned with the formation of the ends of lines. In this situation, the designer could select weighting coefficients that contribute to a corrected data set that would tend to lead to improved end of line formation.

The weighting coefficients for calculating the GFOM can change from iteration to iteration of the OPC simulation tool 24 for any given window 42. In one example, in the initial iterations of the OPC simulation tool 24 for any given window 42, each individual figure of merit value could be heavily weighted. As error in the image relating to a particular individual figure of merit value or values changes (e.g., decreases), the weighting given to that individual figure of merit value can decrease. Additionally, the weighting applied to each individual figure of merit can be progressively reduced to effectively implement a "cooling scheme" in the OPC simulation. That is, the value of the GFOM can be reduced, in part, by the mathematical computation used to derive the GFOM from one iteration to the next. As will be discussed below, the OPC simulation tool 24 can be implemented to end processing of the data set for the selected window 42 if the GFOM falls below a certain threshold. Therefore, mathematically reducing the value of the GFOM can contribute to how many of iterations of the OPC simulation tool 24 are carried out for any given window 42.

In another example, the first iteration or two may focus primarily on edge placement or another process factor by heavily weighting certain individual figure of merits but not others. Thereafter, secondary considerations can become more relevant by adjustments to the weighting coefficients.

In other embodiments, each weighting coefficient can be independently increased or decreased from iteration to iteration, or can be exponentially related to time or the number of prior iterations as indicated by the iteration counter (block 46).

The equation for determining the GFOM for each iteration need not be a weighted sum. In addition, the GFOM for any or all iterations can be user definable, or can be changed using an automated or semi-automated process. Therefore, in one embodiment, the GFOM can be thought of as being a general function of the individual figure of merit values as indicated by equation 2 and that general function is dynamic as the simulation runs from iteration to iteration and/or from window 42 to window 42.

$$GFOM=f\{EPE, CNT, ILS, DF, FC\} \qquad \text{Eq. 2}$$

In this embodiment, the general function for computing GFOM for any given OPC simulation tool 24 iteration and/or any given window 42 can include various linear and non-linear combinations of the individual figure of merit values. The possible ways to combine the individual figure of merits need only be bound by an expectation that the GFOM will contribute to improving image quality and tolerance of at least one process factor variation. As an example, the GFOM could be the sum of a first term calculated by dividing edge placement error by fragmentation complexity and a second term calculated by multiplying contrast, image log slope and the square of depth of focus. Criteria for assisting in establishing the equation for GFOM can include empirical results, geometrical principles relating to edge segment placement and/or specific polygons found in the window 42, theoretical based criteria, principles of optics and/or physics, and so forth.

Processing associated with the OPC simulation tool 24 can continue in block 54 where a determination is made as whether the data set for the topology 44 contained within the selected window 42 has been adequately corrected. In one embodiment, the determination in block 54 can be made solely on number of iterations as indicated by the iteration counter. However, in a more sophisticated routine, the determination of block 54 can be made by an indicator of convergence upon an optimum layout that accommodates for optical distortion and various process factors. In one embodiment, if the GFOM value falls below a predetermined threshold, then correction to the data set for the window 42 can be considered to be satisfactory. The predetermined threshold can vary based on the iteration count.

If, in block 54, additional iterations are to be carried out, the OPC simulation tool 24 can return to block 46. However, if no additional iterations are to be carried out, the OPC simulation tool 24 can proceed to block 56 where the corrected data set (corresponding to a modified topology 44' (FIG. 5)) for the window 42 selected in block 40 can be output into a data file to merged with corrected data sets corresponding to the remainder of the topology 44'. Thereafter, the OPC simulation tool 24 can return to block 40 where the window 42 is logically "slid" over another portion of the topology 44 so that OPC can be carried out on that next portion of the topology 44.

As should be appreciated, the OPC simulation tool 24 improves upon conventional OPC processes by accounting for process factors that could lead to the introduction of error when imaging a pattern on a wafer. The GFOM calculated as part of each iteration of the OPC simulation tool 24 is not only a function of multiple individual figure of merit values to thereby extend upon a single figure of merit OPC technique, but is also calculated in a manner to account for process variations to minimize error that the OPC simulation itself could introduce. Thus, the GFOM can be used to assist in accounting for process variations that edge placement error alone cannot predict.

The OPC simulation tool 24 can be part of a larger software routine for simulating a photolithographic process. For example, additional components can include design rule checking (DRC), optical rules checking (ORC), additional optical and process corrections, layout versus schematic (LVS) checking, and so forth. The OPC simulation tool 24 can include or call various software subroutines and/or can contain executable logic routines. Furthermore, the various routines associated with the flowchart of FIG. 3 can be viewed as depicting steps of a method implemented in the computer system 22. Logic carrying out these various functions can be embedded in software or code for execution by a processor. Also, any portion of the software or code can be embodied in a computer-readable medium for use by or in connection with an instruction execution system such as, for example, a computer. As one skilled in the art will also appreciate, the flowchart of FIG. 3 is exemplary and alternative descriptions and illustrations of the functionality described herein and falling within the scope of the claims appended hereto can be made.

Although the illustrations appended hereto show a specific order of executing functional logic blocks, the order of execution of the blocks can be changed relative to the order shown. Also, two or more blocks shown in succession can be executed concurrently or with partial concurrence. Certain blocks may also be omitted. In addition, any number of commands, state variables, warning semaphores, or messages can be added to the logical flow for purposes of enhanced utility, accounting, performance, measurement, or for providing troubleshooting aids, and the like. It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method for making optical proximity corrections to for a reticle layout topology, comprising:
    a) manipulating edge segments of the reticle layout topology using optical proximity correction (OPC) to generate a corrected reticle layout accounting for optical distortions;
    b) generating a plurality of individual figure of merit values each of which are associated with the corrected reticle layout and correspond to a different process metric;
    c) generating a generalized figure of merit (GFOM) using the plurality of individual figure of merit values; and
    d) manipulating the edge segments of the corrected reticle layout to arrive at a revised corrected reticle layout using OPC guided by the GFOM as a convergence benchmark that indicates a degree of optimization of local critical dimension (CD) accuracy.

2. The method according to claim 1, further comprising
    e) generating a revised plurality of individual figure of merit values associated with the revised corrected reticle layout and generating a revised GFOM using the revised plurality of individual figure of merit values.

3. The method according to claim 2, wherein an equation defining the revised second GFOM differs from an equation defining the GFOM of c).

4. The method according to claim 2, wherein d) to e) are iteratively carried out on the revised corrected reticle layout of the previous iteration guided by the GFOM associated with the revised corrected reticle layout of the previous iteration until the GFOM of e) indicates an acceptable convergence on a reticle layout that accounts for optical distortion and at least one process factor.

5. The method according to claim 1, wherein an equation defining the GFOM is user definable.

6. The method according to claim 1, wherein at least one of the individual figure of merit values is user definable.

7. The method according to claim 1, wherein the individual figure of merit values are selected from edge placement error, image contrast, depth of focus, image slope, fragmentation complexity and combinations thereof.

8. The method according to claim 1, wherein the individual figure of merit values include at least image contrast.

9. The method according to claim 1, wherein the individual figure of merit values include at least depth of focus.

10. The method according to claim 1, wherein the individual figure of merit values include at least image slope.

11. The method according to claim 1, wherein the individual figure of merit values include at least fragmentation complexity.

12. The method according to claim 1, wherein the GFOM is a weighted sum of each individual figure of merit value.

13. The method according to claim 1, wherein a) to d) are carried out for a portion of the reticle layout topology defined by a logical window.

14. The method according to claim 1, wherein the GFOM is calculated to account for process variations to which the OPC edge segment manipulations make the corrected reticle layout unstable.

15. A program embodied in computer readable medium to make optical proximity corrections to a reticle layout topology, comprising:
    a) code that manipulates edge segments of the reticle layout topography using optical proximity correction (OPC) to generate a corrected reticle layout accounting for optical distortions;
    b) code that generates a plurality of individual figure of merit values each of which are associated with the corrected reticle layout and correspond to a different process metric;
    c) code that generates a generalized figure of merit (GFOM) using the plurality of individual figure of merit values; and
    d) code that manipulates the edge segments of the corrected reticle layout to arrive at a revised corrected reticle layout using OPC guided by the GFOM as a convergence benchmark that indicates a degree of optimization of local critical dimension (CD) accuracy.

16. The program embodied in computer readable medium according to claim 15, further comprising:
    e) code that generates a revised plurality of individual figure of merit values associated with the revised corrected reticle layout and generates a revised GFOM using the revised plurality of individual figure of merit values.

17. The program embodied in computer readable medium according to claim 16, wherein an equation defining the revised GFOM differs from an equation defining the GFOM of c).

18. The program embodied in computer readable medium according to claim 16, further comprising code that iteratively carries out d) to e) on the revised corrected reticle layout of the previous iteration guided by the GFOM associated with the revised corrected reticle layout of the previous iteration until the GFOM indicates an acceptable convergence on a reticle layout that accounts for optical distortion and at least on process factor.

19. The program embodied in computer readable medium according to claim 15, wherein the individual figure of merit values are selected from edge placement error, image contrast, depth of focus, image slope, fragmentation complexity and combinations thereof.

20. The program embodied in computer readable medium according to claim 15, wherein the GFOM is a weighted sum of each individual figure of merit value.

21. The program embodied in computer readable medium according to claim 15, wherein a) to d) are carried out for a portion of the reticle layout topology defined by a logical window.

22. The program embodied in computer readable medium according to claim 15, wherein the GFOM is calculated to account for process variations to which the OPC edge segment manipulations make the corrected reticle layout unstable.

* * * * *

UNITED STATES PATENT AND TRADEMARK OFFICE
CERTIFICATE OF CORRECTION

PATENT NO.     : 6,978,438 B1
DATED          : December 20, 2005
INVENTOR(S)    : Luigi Capodieci It is certified that error appears in the above-identified patent and that said Letters Patent is hereby corrected as shown below:

Column 8,
Line 40, replace "+$\epsilon F(FC)$" with -- +$\epsilon(FC)$ --.

Signed and Sealed this

Fourteenth Day of February, 2006

JON W. DUDAS
*Director of the United States Patent and Trademark Office*